United States Patent [19]

Sawada

[11] Patent Number: 5,258,632
[45] Date of Patent: Nov. 2, 1993

[54] VELOCITY MODULATION TRANSISTOR

[75] Inventor: Minoru Sawada, Hirakata, Japan

[73] Assignee: Sanyo Electric Co., Ltd., Moriguchi, Japan

[21] Appl. No.: 745,260

[22] Filed: Aug. 14, 1991

[30] Foreign Application Priority Data

Aug. 31, 1990 [JP] Japan .................................. 2-231692

[51] Int. Cl.$^5$ .................... H01L 29/205; H01L 29/80
[52] U.S. Cl. ........................ 257/194; 257/20
[58] Field of Search ............... 357/22, 4, 16, 194, 357/20

[56] References Cited

U.S. PATENT DOCUMENTS

| | | | |
|---|---|---|---|
| 4,194,935 | 3/1980 | Dingle | 357/22 |
| 4,688,061 | 8/1987 | Sakaki | 357/16 |
| 4,764,796 | 8/1988 | Sasaki et al. | 357/22 |
| 4,806,998 | 2/1989 | Vintner | 357/22 |
| 4,894,691 | 1/1990 | Matsui | 357/22 |

FOREIGN PATENT DOCUMENTS 61-144070  7/1986  Japan .................................. 357/4
62-245680 10/1987  Japan .................................. 357/22

OTHER PUBLICATIONS

H. Sakaki, *Japanese Journal of Applied Physics*, vol. 21, No. 6 Jun. 1982 pp. L381-L383.
Okuno, et al., Extended Abstracts (The 50th Autumn Meeting 1989), *The Japan Society of Applied Physics*.

*Primary Examiner*—Jerome Jackson

[57] ABSTRACT

A velocity modulation transistor has a first barrier layer, first channel layer, second barrier layer, second channel layer, third barrier layer, input/output electrode that and control electrode are laminated on a semi-insulative substrate in this order, The electron affinity of the first channel layer is larger than that of the second channel layer. The energy difference between the first level and the second level can be obtained according to the difference in the electron affinity between the first and second channel layers as well as to the control of the film thickness of the first and second channel layers, whereby the velocity modulation effect at room temperature becomes large.

4 Claims, 7 Drawing Sheets

VELOCITY MODULATION TRANSISTOR

BACKGROUND OF THE INVENTION

1. Field of the Invention

The present invention relates to a velocity modulation transistor, especially to a velocity modulation transistor utilizing double quantum well structure.

2. Description of Related Art

A heterojunction transistor, wherein a semiconductor having a narrow band gap close to a hetero-interface is made to be a channel, the hetero-interface being formed by joining a semiconductor having a broad band gap as an electron supply layer and the semiconductor having a narrow band gap in which electrons can move at high speed, performs switching by adjusting the concentration of electrons flowing through the channel. Accordingly, the time required for charging/discharging electrons decides the operational speed of the heterojunction transistor. In order to overcome such a limitation of the operational speed, a heterojunction transistor which performs switching by modulating the speed of electrons has been proposed (H. Sakaki; Jpn. J. Appl. Phys. Vol. 21, No. 6, June 1982 pp. L381-L383).

This heterojunction transistor, called a velocity modulation transistor (hereinafter to be called VMT), comprises two heterojunctions formed between two channel layers differing in impurity concentration from each other and two gate electrodes sandwiching the two heterojunctions therebetween. By changing bias voltages of these gate electrodes, characteristics of the channel layers through which carriers flow can be changed. A change of channel conductance ($\Delta G$) to a change of bias voltage ($\Delta V$) is obtained according to the following equation (1).

$$\Delta G = q \cdot \mu\text{eff} \cdot \Delta N + q \cdot N \cdot \Delta \mu\text{eff} \quad (1)$$

q: electric charge of carrier
$\mu$eff: carrier mobility
$\Delta N$: a change of carrier concentration
N: carrier concentration
$\Delta \mu$eff: a change of carrier mobility In such a velocity modulation transistor, two gate electrodes are necessary, and moreover, one of them must be provided inside the velocity modulation transistor.

A velocity modulation transistor capable of operating in the same way as the above-mentioned having only one gate electrode has been proposed (Okuno, et al.; Extended Abstracts (The 50th Autumn Meeting 1989), The Japan Society of Applied Physics).

FIG. 1 is a schematic sectional view of such a velocity modulation transistor comprising one gate electrode. In the figure, reference numeral 41 designates a semi-insulative GaAs substrate. On the GaAs substrate 41, a GaAs layer 42, an n-type AlGaAs layer 43, a GaAs layer 44, an AlGaAs layer 45, an n-type GaAs layer 46 and an n-type AlGaAs layer 47 are laminated in this order. On the peripheral portion of the AlGaAs layer 47, an n-type GaAs layer 48 is formed, a source electrode 50 and a drain electrode 51 being formed on the GaAs layer 48. On the central portion of the AlGaAs layer 47 on which the GaAs layer 48 is not formed, a gate electrode 49 is formed. In addition, the GaAs layer 44 is thicker than the GaAs layer 46.

The velocity modulation transistor is so constructed that two kinds of channel layers (GaAs layers 44, 46) may be separated from each other by the barrier layer (AlGaAs layer 45). In the state where bias voltage is not applied to the gate electrode 49, as the lowest quantum level (first level) in the GaAs layer 46 is higher than the lowest quantum level (second level) in the GaAs layer 44, electrons of lowest quantum level in the transistor exist only in the channel layer (GaAs layer 44) having a broad well width (film thickness). Electrons of the second lowest quantum level in the transistor exist only in the channel layer (GaAs layer 46) having a narrow well width. In addition, in this velocity modulation transistor, as Si is doped in only the GaAs layer 46, electron mobility in the channel layer (GaAs layer 46) having the narrow well width is lower than that in the channel layer (GaAs layer 44) having the broad well width.

Therefore, by changing the channel through which electrons flow from the channel layer (GaAs layer 44) of high electron mobility to the channel layer (GaAs layer 46) of low election mobility according to the application of bias voltage to the gate electrode 49, switching can be performed. That is, by utilizing this method, whereby the first level becomes lower than the second level according to the application of bias voltage to the gate electrode 49, switching can be performed.

Since both channel layers in above-mentioned velocity modulation transistor are GaAs layers, band gaps of the two channel layers are same. Therefore, the film thickness of each GaAs layer is appropriately controlled in order to make the first level higher than the second level in the state where bias voltage is not applied to the gate electrode 49. But there is a limitation of energy difference between the first level and the second level obtained by the control of the film thickness. In this way, in above-mentioned velocity modulation transistor, as the energy difference between the first level and second level is as small as about 0.1 eV, a problem exists in that there is a high probability of existence of electrons in the two channel layers, thereby reducing the velocity modulation effect for operation state at room temperature.

SUMMARY OBJECTS AND OF THE INVENTION

The velocity modulation transistor of the invention has a first barrier layer, first channel layer, second barrier layer, second channel layer, third barrier layer, an input and an output electrode and control electrode laminated on a semi-insulative substrate in this order, the electron affinity of the first channel layer being larger than that of the second channel layer. The velocity modulation transistor of the invention is capable of obtaining an energy difference between the first level and second level according to the difference of electron affinity between the first channel layer and the second channel layer the film thickness of the first channel layer is larger than that of the second channel layer. Accordingly the possibility of the existence of electrons in both of the channel layers during operation at room temperature is lower than in a conventional device.

The primary object of the invention is to provide a velocity modulation transistor capable of making the velocity modulation effect larger at room temperature when compared with a conventional device.

Another object of the invention is to provide a velocity modulation transistor capable of making the energy difference between the first level and the second level larger when compared with a conventional device.

A further object of the invention is to provide a velocity modulation transistor capable of obtaining a large energy difference between the first level and the second level without lowering electron mobility by making the first channel layer a superlattice film.

The above and further objects and features of the invention will more fully be apparent from the following detailed description of the accompanying drawings.

DETAILED DESCRIPTION OF THE PREFERRED EMBODIMENTS

Figure 1:
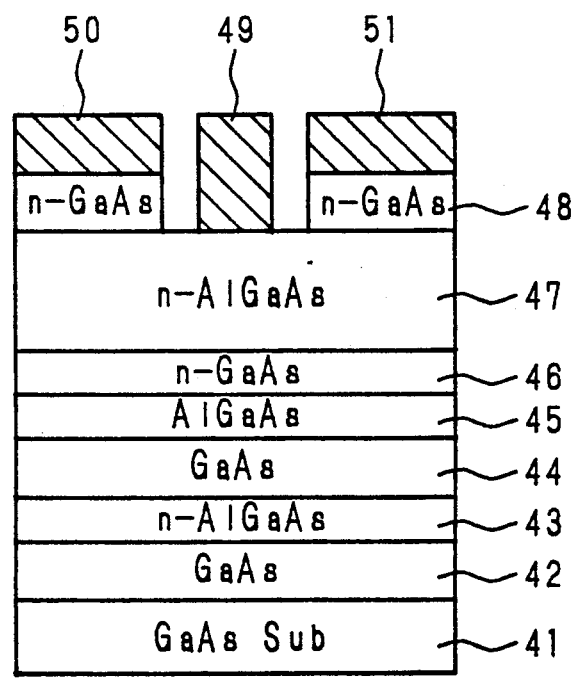
FIG. 1 is a schematic sectional view of a conventional velocity modulation transistor.

The following is an explanation of the invention referring to the drawings showing the embodiments thereof.

First Embodiment

Figure 2:
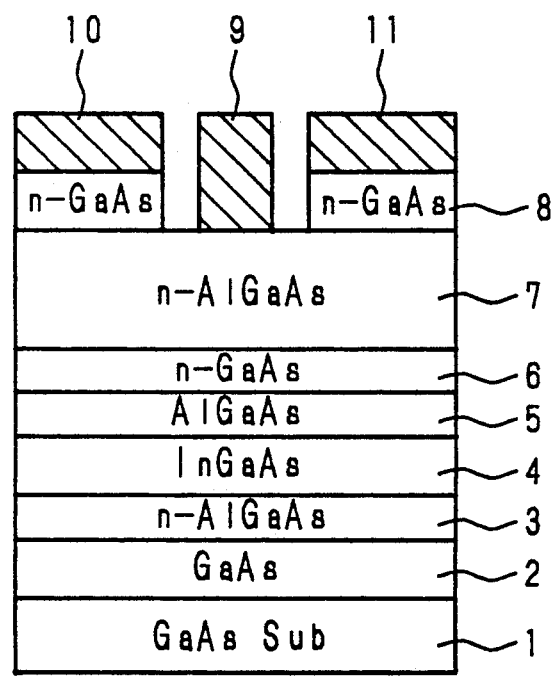
FIG. 2 is a schematic sectional view of a first embodiment of a velocity modulation transistor of the invention.

FIG. 2 shows a structure of the first embodiment of the invention, and reference numeral 1 in the figure designates a semi-insulative GaAs substrate (semi-insulative substrate). On the GaAs substrate 1, a GaAs layer 2, an n-type AlGaAs layer (first barrier layer) 3, in which Si has been doped, an InGaAs layer (first channel layer; In composition ratio is 0.25) 4, an AlGaAs layer (second barrier layer) 5, an n-type GaAs layer (second channel layer) 6 in which Si has been doped and n-type AlGaAs layer (third barrier layer; Al composition ratio is 0.3) 7 in which Si has been doped are laminated in this order. On the peripheral portion of the AlGaAs layer 7, an n-type GaAs layer 8 in which Si has been doped is formed, a source electrode (input electrode) 10 and a drain electrode (output electrode) 11 are also formed on the GaAs layer 8. On the central portion of the AlGaAs layer on which the GaAs layer 8 is not formed, a gate electrode (control electrode) is formed. In addition, the band gaps Eg of the InGaAs layer 4 and GaAs layer 6 are about 1.08 eV and about 1.42 eV respectively, and the film thicknesses of the InGaAs layer 4 and GaAs layer 6 are 100 Å and 70 Å respectively.

A brief explanation will now be given of the production method of a velocity modulation transistor of such a structure. On the semi-insulative GaAs substrate 1, the GaAs layer 2, n-type AlGaAs layer 3 in which Si has been doped, InGaAs layer 4, AlGaAs layer 5, n-type GaAs layer 6 in which Si has been doped, n-type AlGaAs layer 7 in which Si has been doped, and n-type GaAs layer 8 in which Si has been doped, are formed successively. On the AlGaAs layer 7, exposed after getting rid of a part of the GaAs layer 8 by etching, the gate electrode 9 is formed. The source electrode 10 and drain electrode 11 are formed on the remaining GaAs layer 8, thereby producing such a velocity modulation transistor as shown in FIG. 2.

Figure 3:
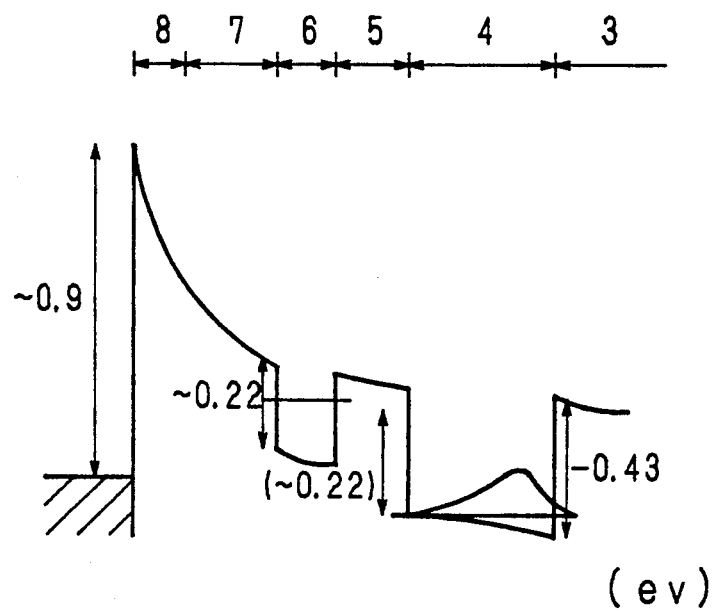
FIG. 3 is a view showing a conduction band structure immediately under a gate in the state where DC voltage is applied between a source electrode and a drain electrode without applying bias voltage to a gate electrode, in the first embodiment.

The conduction band structure immediately under the gate electrode of the velocity modulation transistor of the first embodiment. In the state showing DC voltage is applied between the source electrode 10 and the drain electrode 11 without applying bias voltage Vg to the gate electrode 9. As is clear from FIG. 3, electrons flow through the InGaAs layer (first channel layer) 4 and the electron mobility is as large as 8,000 cm$^2$/Vs there, which corresponds to ON state of the velocity modulation transistor. In addition, numerical values in the figure are the calculated approximate values. The approximate value of energy difference between energy levels of both of the quantum wells are the calculated values in the case where it is assumed that there is no effect of bias voltage on both of wells.

Figure 4:
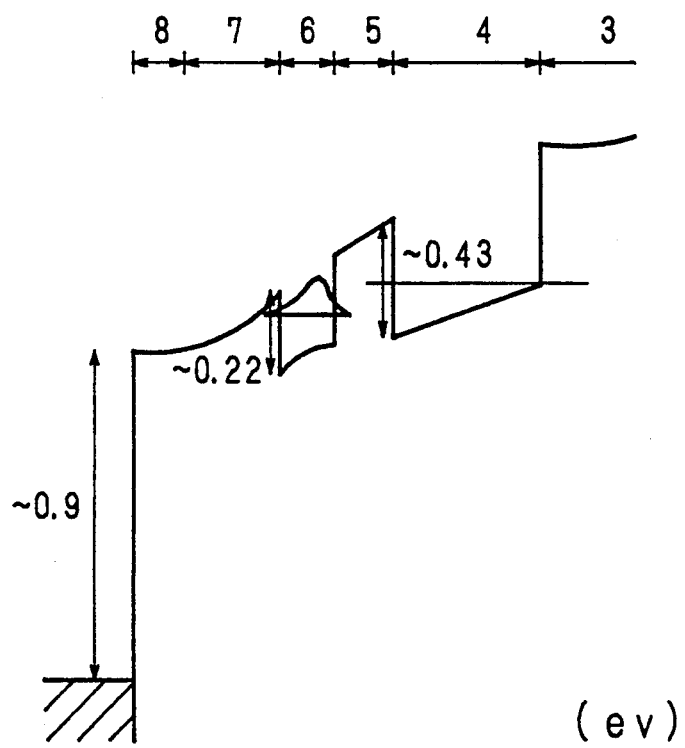
FIG. 4 is a view showing a conduction band structure immediately under a gate in the state where bias voltage is applied to a gate electrode, in the first embodiment.

In the above-mentioned state, when bias voltage Vg is applied to the gate electrode 9, the distribution of the electrostatic potential of the conduction band structure immediately under the gate is as shown in FIG. 4. As is clear from FIG. 4, according to the electric field caused by bias voltage Vg and the tunneling effect, electrons can now move at high speed from the InGaAs layer (first channel layer) 4 to the GaAs layer (second channel layer) 6, i.e., higher velocity. As Si is doped in the GaAs layer 6, the electron mobility in the GaAs layer 6 is as small as 2,000 cm$^2$/Vs, which corresponds to the OFF state of the velocity modulation transistor.

The switching time of such a velocity modulation transistor depends upon the time period of electrons moving from the InGaAs layer 4 to the GaAs layer 6. This time period is shorter than that time required for charging/discharging electrons. The energy difference between the first level and the second level is about 0.22 eV, largely exceeding the energy difference about 0.1 eV of the conventional example shown in FIG. 1. Accordingly, in the velocity modulation transistor of the invention, the velocity modulation effect at room temperature is large when compared with a conventional device.

Second Embodiment

Figure 5:
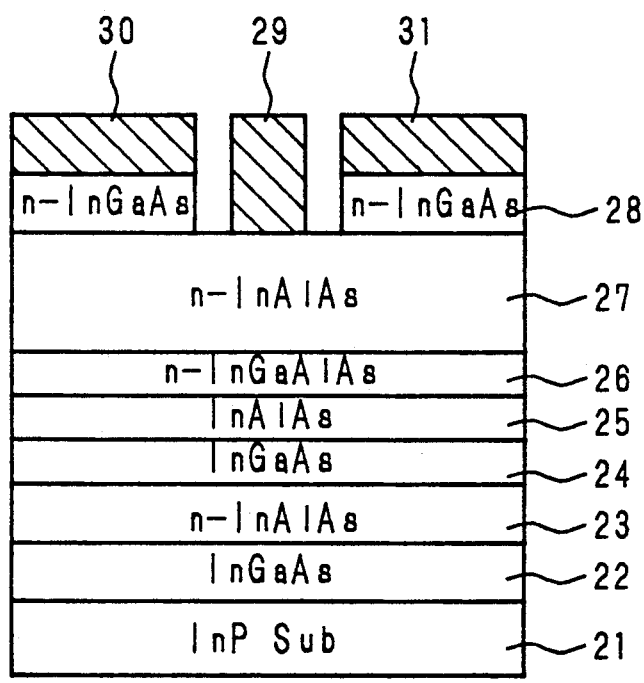
FIG. 5 is a schematic sectional view of a second embodiment of a velocity modulation transistor of the invention.

FIG. 5 shows a construction of a second embodiment of the invention. There, reference numeral 21 designates a semi-insulative InP substrate (a semi-insulative substrate). On the InP substrate 21, an InGaAs layer 22, an n-type InAlAs layer (first barrier layer) 23 in which Si has been doped, an InGaAs layer (first channel layer; In composition ratio 0.53) 24, an InAlAs layer (second barrier layer) 25, an n-type InGaAlAs layer (second channel layer) 26 in which Si has been doped and an n-type InAlAs layer (third barrier layer; In composition ratio 0.52) 27 in which Si has been doped, are laminated in this order. On the peripheral portion of the InAlAs layer 27, an n-type InGaAs layer 28 in which Si has been doped is formed, a source electrode (input electrode) 30 and a drain electrode (output electrode) 31 being formed on the InGaAs layer 28. On the central portion of the InAlAs layer 27 on which the InGaAs layer 28 is not formed, a gate electrode (control electrode) 29 is formed. In addition, the band gaps of the InGaAs layer 24 and InGaAlAs layer 26 are about 0.75 eV and about 1.10 eV respectively, and the film thicknesses thereof are 100 Å and 70 Å respectively.

Since the production method of a velocity modulation transistor of this type is basically the same as the first embodiment above-mentioned, the explanation therefor will be omitted.

When DC voltage is applied between the source electrode 30 and the drain electrode 31 without applying bias voltage Vg to the gate electrode 29 of the velocity modulation transistor of the second embodiment, electrons flow through the InGaAs layer (first channel layer) 24. The electron mobility of the first channel layer 24 is as large as 11,000 cm$^2$/Vs which corresponds to ON-state of the velocity modulation transistor. In addition, when bias voltage Vg is applied to the gate electrode 29 in this state, electrons move at high speed from the InGaAs layer (first channel layer) 24 to the InGaAlAs layer (second channel layer) 26, according to the electric field caused by bias voltage Vg and the tunneling effect. As Si is doped in the InGaAlAs layer 26, the electron mobility in the InGaAlAs layer 26 is as small as 1,000 cm$^2$/Vs which corresponds to the OFF-state of the velocity modulation transistor.

The switching time of the velocity modulation transistor of the second embodiment depends upon the time period required for electrons to move from the InGaAs layer 24 to the InGaAlAs layer 26. The time period being shorter when compared with the time required for charging/discharging electrons. The energy difference between the first level and the second level is about 0.25 eV, larger than that of the first embodiment. In addition, In composition ratio in the InGaAs layer 24 is larger than that in the InGaAs layer 4 of the first embodiment, and the electron mobility in the second embodiment is also larger when compared with the first embodiment. Therefore, the velocity modulation effect of the velocity modulation transistor of the second embodiment at room temperature is also larger than that of a conventional device, and is also larger than that of the first embodiment.

Third Embodiment

In the first embodiment, the energy difference between the first level and the second level of the velocity modulation transistor (sample A) in which In composition ratio of the InGaAs layer 4 is 0.2 is 0.18 eV. The energy difference between the first level and the second level of the velocity modulation transistor (sample B) in which In composition ratio in the InGaAs layer 4 is 0.35 is 0.29 eV. In this way, as the In composition ratio of the InGaAs layer 4 is made larger, that is, as the band gap thereof is made smaller, the energy difference between the first level and the second level can be made larger. Therefore, it is desirable for the In composition ratio in the InGaAs layer 4 larger when taking only the operation at room temperature into consideration.

But, when the In composition ratio in the InGaAs layer 4 is made larger, dislocation caused by lattice strain between the InGaAs layer 4 and the AlGaAs layer 5 becomes larger, thereby lowering electron mobility. The electron mobility of the sample A is 7,600 cm$^2$/Vs, and that of the sample B is 4,000 cm$^2$/Vs. In this way, when the In composition ratio is made larger by taking only the energy difference between the first level and the second level into consideration, the electron mobility is drops accordingly.

The third embodiment of the invention has been devised in order to solve such a problem. In the third embodiment, a large energy difference is obtained between the first level and the second level without lowering the electron mobility.

Figure 6:
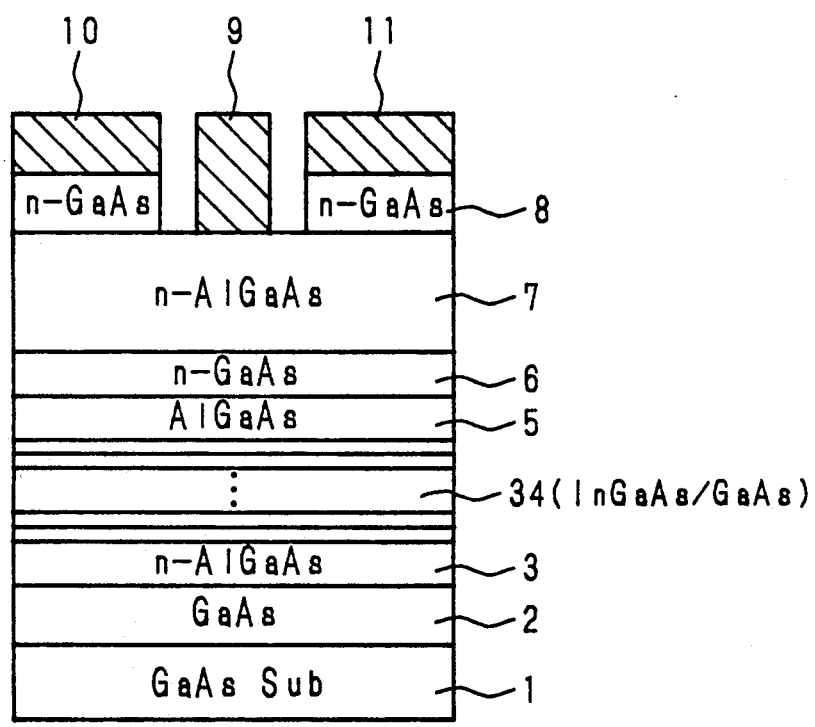
FIG. 6 is a schematic sectional view of a third embodiment of a velocity modulation transistor of the invention.

FIG. 6 shows a construction of the third embodiment of invention. In the figure, the parts of the same numerals as in FIG. 2 show the same parts in the first embodiment. The difference between of the third embodiment and the first embodiment is that the former uses a superlattice film 34 (first channel layer) in which a plurality of InGaAs layers (In composition ratio 0.5) of six-molecule layers and GaAs layers of three-molecule layer are laminated one by one alternately, in place of the InGaAs layer (first channel layer) 4.

The average In composition ratio of the superlattice film 34 is 0.35, however, the electron mobility becomes 8,600 cm$^2$/Vs as the superlattice film 34 is excellent in restraining the generation of dislocation due to lattice mismatch between the AlGaAs layer 5 and itself. In this way, in the third embodiment, the superlattice film 34 is used as the first channel layer instead of the InGaAs layer 4. Concomitantly, the generation of dislocation due to lattice strain is minimized whereby a large energy difference (about 0.29 eV) between the first level and the second level can be obtained without lowering the electron mobility.

Figure 7:
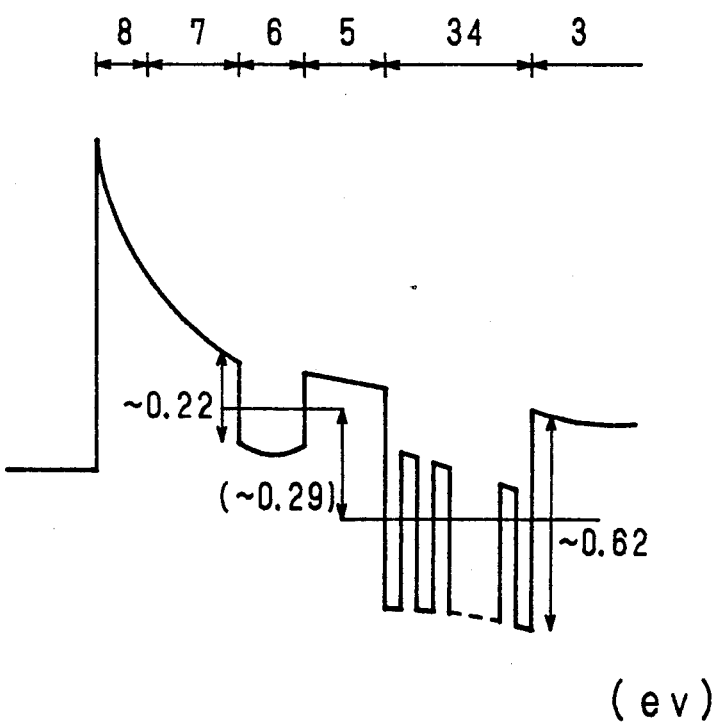
FIG. 7 is a view showing a conduction band structure immediately under a gate in the state where DC voltage is applied between a source electrode and a drain electrode without applying bias voltage to a gate electrode, in the third embodiment.

The conduction band structure of a velocity modulation transistor of the third embodiment immediately under the gate is shown in FIG. 7 in the state where DC voltage is applied between the source electrode 10 and the drain electrode 11 without applying bias voltage Vg to the gate electrode 9. The figure shows that the numerical values shown in the figure are the calculated approximate values.

In addition, as a superlattice film, the InGaAs layer and GaAs layer are combined. However, the present invention it is not limited thereto. The combination of the InAs layer and GaAs layer or the like is possible. Moreover, also in the second embodiment, it is also possible to obtain a large energy difference between the first level and the second level without lowering the election mobility if the superlattice film is used instead of the InGaAs layer (first channel layer) 24.

Furthermore, in the above-mentioned embodiments, the GaAs layer 2, GaAs layer 8, InGaAs layer 22, InGaAs layer 28 are not always necessary. Including these layers does no harm they are nor does it matter that the AlGaAs layer 7, InAlAs layer 27 are non-doped ones.

As this invention may be embodied in several forms without departing from the spirit of essential characteristics thereof, the embodiments described herein are therefore illustrative and not restrictive. Further, since the scope of the invention is defined by the appended claims rather than by the description preceding them, all changes that fall within the metes and bounds of the claims or equivalence of such metes and bounds thereof are therefore intended to be embraced by the claims.

What is claimed is:

1. A velocity modulation transistor, comprising:
   a semi-insulative substrate;
   a semiconductor layer formed on said semi-insulative substrate;

a first barrier layer formed on said semiconductor layer wherein said first barrier layer is an n-type AlGaAs layer;

a first channel layer formed on said first barrier layer wherein said first channel layer is an InGaAs layer;

a second barrier layer formed on said first channel layer wherein said second barrier layer is an AlGaAs layer;

a second channel layer comprising n-type GaAs formed on said second barrier layer, wherein a film thickness of said first channel layer is larger than a film thickness of said second channel layer, and a band gap of said first channel layer is smaller than a band gap of said second channel layer;

a third barrier layer formed on said second channel layer wherein said third barrier layer is n-type AlGaAs;

a third semiconductor layer partially formed on said third barrier layer whereon an input and an output electrode are formed; and a control electrode formed on a surface area of said third barrier layer where said third semiconductor layer is not present, wherein the electron affinity of said first channel layer is larger than that of said second channel layer.

2. A velocity modulation transistor comprising:

a semi-insulative substrate;

a semiconductor layer formed on said semi-insulative substrate;

a first barrier layer formed on said semiconductor layer wherein said first barrier layer is an n-type AlGaAs layer;

a first channel layer formed on said first barrier layer;

a second barrier layer formed on said first channel layer wherein said second barrier layer is an AlGaAs layer;

a second channel layer formed on said second barrier layer, wherein a film thickness of said first channel layer is larger than a film thickness of said second channel layer, and a band gap of said first channel layer is smaller than a band gap of said second channel layer;

a third barrier layer formed on said second channel layer wherein said third barrier layer is n-type AlGaAs;

a third semiconductor layer partially formed on said third barrier layer whereon an input and an output electrode are formed;

a control electrode formed on a surface area of said third barrier layer where said third semiconductor layer is not present, wherein the electron affinity of said first channel layer is larger than that of said second channel layer; and said first channel layer being an InGaAs layer and said second channel layer being an n-type InGaAlAs layer.

3. A velocity modulation transistor comprising:

a semi-insulative substrate;

a semiconductor layer formed on said semi-insulative substrate;

a first barrier layer formed on said semiconductor layer;

a first channel layer formed on said first barrier layer wherein said first channel layer is an InGaAs layer;

a second barrier layer formed on said first channel layer;

a second channel layer comprising n-type InGaAlAs formed on said second barrier layer, wherein a film thickness of said first channel layer is larger than a film thickness of said second channel layer, and a band gap of said first channel layer is smaller than a band gap of said second channel layer;

a third barrier layer formed on said second channel layer;

a third semiconductor layer partially formed on said third barrier layer whereon an input and an output electrode are formed;

a control electrode formed on a surface area of said third barrier layer where said third semiconductor layer is not present, wherein the electron affinity of said first channel layer is larger than that of said second channel layer; and said first barrier being an n-type InAlAs layer, said second barrier layer being an InAlAs layer, and said third barrier layer being an n-type InAlAs layer.

4. A velocity modulation transistor, comprising:

a semi-insulative substrate;

a semiconductor layer formed on said semi-insulative substrate;

a first barrier layer formed on said semiconductor layer wherein said first barrier layer is an n-type AlGaAs layer;

a first channel layer formed on said first barrier layer wherein said first channel layer is a superlattice film layer in which a plurality of InGaAs layers and GaAs layers are laminated and alternately interleaved therein;

a second barrier layer formed on said first channel layer wherein said second barrier layer is an AlGaAs layer;

a second channel layer comprising n-type GaAs formed on said second barrier layer;

a third barrier layer formed on said second channel layer wherein said third barrier layer is n-type AlGaAs;

a third semiconductor layer partially formed on said third barrier layer whereon an input and an output electrode are formed; and a control electrode formed on a surface area of said third barrier layer where said third semiconductor layer is not present, wherein the electron affinity of said first channel layer is larger than that of said second channel layer.

* * * * *